United States Patent [19]
Pascucci et al.

[11] Patent Number: 5,532,972
[45] Date of Patent: Jul. 2, 1996

[54] METHOD AND CIRCUIT FOR TIMING THE READING OF NONVOLATILE MEMORIES

[75] Inventors: Luigi Pascucci, Sesto San Giovanni; Silvia Padoan, Rimini; Carla M. Golla, Sesto San Giovanni; Marco Maccarrone, Palestro; Marco Olivo, Bergamo, all of Italy

[73] Assignee: SGS-Thomson Microelectronics, S.r.l., Milan, Italy

[21] Appl. No.: 391,920

[22] Filed: Feb. 21, 1995

[30]   Foreign Application Priority Data

Feb. 18, 1994 [EP]   European Pat. Off. .............. 94830074

[51] Int. Cl.⁶ ..................................................... G11C 7/00
[52] U.S. Cl. ..................... 365/233; 365/194; 365/189.01
[58] Field of Search ................................. 365/233, 333.5, 365/194, 189.01, 189.05

[56]   References Cited

U.S. PATENT DOCUMENTS

| 4,827,454 | 5/1989 | Okazaki ............................... 365/233.5 |
| 5,432,747 | 7/1995 | Fuller et al. ............................ 365/233 |
| 5,463,581 | 10/1995 | Koshikawa .............................. 365/233 |

FOREIGN PATENT DOCUMENTS

| 0322901 | 7/1989 | European Pat. Off. .......... G11C 7/00 |
| 0560623 | 9/1993 | European Pat. Off. .......... G11C 7/00 |

*Primary Examiner*—David C. Nelms
*Assistant Examiner*—Vũ A. Lê
*Attorney, Agent, or Firm*—David V. Carlson; Seed and Berry

[57]   ABSTRACT

A circuit comprises a section generating a pulse signal for asynchronously enabling the read phases; a section generating precharge and detecting signals of adjustable duration, for controlling data reading from the memory and data supply to the output buffers; a section generating a noise suppressing signal for freezing the data in the output buffers during loading into the output circuits, and the duration of which is exactly equal to the propagation time of the data to the output circuits of the memory, as determined by propagating a data simulating signal in an output simulation circuit; a section generating a loading signal, the duration of which may be equal to that of the noise suppressing signal or extended by an extension circuit in the event the array presents slower elements which may thus be read; and a section generating a circuit reset signal.

13 Claims, 5 Drawing Sheets

5,532,972

METHOD AND CIRCUIT FOR TIMING THE READING OF NONVOLATILE MEMORIES

Cross-Reference to Related Applications

The present application claims priority from European Patent Application No. 94830074.4, filed Feb. 18, 1994, and incorporated herein by reference. The present application is related to pending U.S. patent application entitled "METHOD AND CIRCUIT FOR TIMING THE LOADING OF NONVOLATILE-MEMORY OUTPUT DATA", by Luigi Pascucci, Marco Maccarrone and Marco Olivo, Ser. No. 08/391,160 and filed on Feb. 21, 1995, which claims priority from European Patent Application No. 94830069.4, filed on Feb. 18, 1994; U.S. patent application entitled "INTERNAL TIMING METHOD AND CIRCUIT FOR PROGRAMMABLE MEMORIES", by Luigi Pascucci, Marco Olivo and Carla Maria Golla, Ser. No. 08/391,159 and filed on Feb. 21, 1995, which claims priority from European Patent Application No. 94830070.2, filed on Feb. 18, 1994; U.S. patent application entitled "LOAD SIGNAL GENERATING METHOD AND CIRCUIT FOR NONVOLATILE MEMORIES", by Luigi Pascucci and Carla Maria Golla, Ser. No. 08/391,146 and filed on Feb. 21, 1995, which claims priority from European Patent Application No. 94830071.0, filed on Feb. 18, 1994; U.S. patent application entitled "PROGRAMMABLE LOGIC ARRAY STRUCTURE FOR SEMICONDUCTOR NONVOLATILE MEMORIES, PARTICULARLY FLASH-EEPROMs", by Silvia Padoan and Luigi Pascucci, Ser. No. 08/391,149 and filed on Feb. 21, 1995, which claims priority from European Patent Application No. 94830072.8, filed on Feb. 18, 1994; U.S. patent application entitled "METHOD AND CIRCUIT FOR SUPPRESSING DATA LOADING NOISE IN NONVOLATILE MEMORIES", by Luigi Pascucci, Carla Maria Golla and Marco Maccarrone, Ser. No. 08/391,147 and filed on Feb. 21, 1995, which claims priority from European Patent Application No. 94830073.6, filed on Feb. 18, 1994; all of which are incorporated herein by reference.

TECHNICAL FIELD

The present invention relates to a read timing method and circuit for nonvolatile memories.

BACKGROUND OF THE INVENTION

As is known, there is an increasing demand for memories characterized by flexibility, low power consumption, and immunity to noise. These characteristics are difficult to achieve simultaneously because each can only be obtained at the expense of the others. As such, a trade-off is inevitable, bearing in mind its effect in terms of technological yield, and the difficulty of achieving an all-round solution suitable for all applications.

A timer, for example, is useful in reducing power consumption, but being invariably rigid, it responds poorly to certain inevitable technological changes that are better catered to by a static type of architecture. Moreover, a timed architecture, though it provides for solving certain noise, dissipation and speed problems, is limited in situations where certain lines are slowly brought up to the steady-state condition.

Countless additional factors (e.g., slow storage locations, component characteristic shift, localized nonuniform behavior) also exist, and require specific measures to be taken to ensure adequate reliability of the memory.

SUMMARY OF THE INVENTION

It is an object of the present invention to provide a timer which, taking into account the specific situations involved and notwithstanding the presence of conflicting requirements, provides for optimum performance of the memory.

According to the present invention, there is provided a flexible architecture for modulating the basic signals and cycle times at various points. The architecture is enabled by switching edges, is programmable, and is protected against noise.

In accordance with one aspect of the present invention, a read timing method is provided for a nonvolatile memory comprising at least an output element, a buffer unit, and an output simulation unit having the same or substantially the same propagation delay as the output element. The method includes generating a read enable signal and enabling a precharge phase of predetermined adjustable duration upon receiving the read enabling signal. At the end of the precharge phase, an evaluation phase is enabled. A predetermined adjustable time after the evaluation phase is enabled, a data simulating signal is generated. Propagation of the simulating signal through the output simulation unit is enabled simultaneously with the data loading from the buffer unit into the output circuit and the disabling of the switching of the buffer unit. Upon detecting propagation of the simulating signal, the disabling of the switching of the buffer unit is interrupted. After a predetermined adjustable delay, the loading phase is interrupted. After disabling of the load signal, the nonvolatile memory is reset.

BRIEF DESCRIPTION OF THE DRAWINGS

A non-limiting embodiment of the present invention is described by way of example with reference to the accompanying drawings, in which.

DETAILED DESCRIPTION OF THE INVENTION

Figure 1:
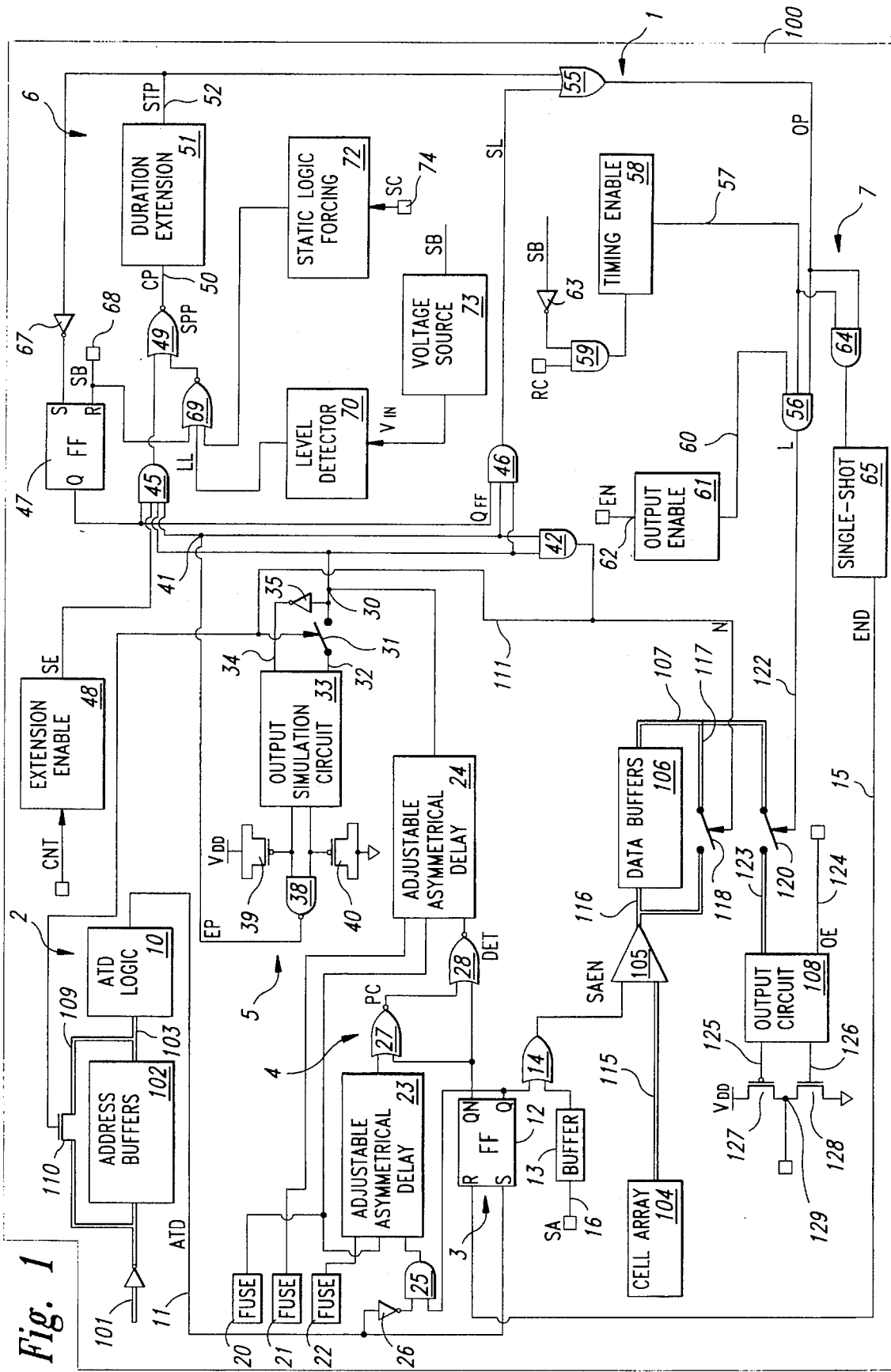
FIG. 1 is an embodiment of the timing circuit according to the present invention.

FIG. 1 shows a timing circuit 1 that forms part of a nonvolatile, flash type memory 100, of which only a number of parts, timed by circuit 1, are shown. More specifically, memory 100 includes the following components: an external address bus 101, an address buffer unit 102, an internal address bus 103, a memory cell array 104, an amplifying unit 105, a data buffer unit 106, a data bus 107, and an output circuit 108.

Address buffer unit 102 is formed from a number of buffers, and is input-connected to external address bus 101, and output-connected to internal address bus 103. Unit 102 is feedback controlled by an address feedback bus 109 formed by a number of lines along which are provided switches controlled by a single control signal and of which only one is shown in the form of an N-channel transistor 110 with its gate terminal connected to a line 111 supplying a noise suppressing signal N. Feedback by line 109 prevents the data stored in the buffers of unit 102 from switching in the event of noise on output bus 103 or switching on bus 101, by "freezing" the data to the previous value. Internal address bus 103 is connected to an address decoding section (not shown) and a logic unit 10 generating an asynchronous signal ATD as explained below.

Array 104 and amplifying unit 105 are connected by a bus 115. Unit 105 (formed by a number of sense amplifiers) and data buffer 106 are connected by a bus 116. Unit 106 (formed by a number of buffers) is feedback controlled by a data feedback bus 117 formed from a number of lines along which are provided switches controlled by a single control signal and only one of which, 118, is shown with its control input connected to line 111. As in the case of line 109, feedback line 117 provides for blocking the data stored in the output buffers of unit 106 as long as switches 118 are closed, and regardless of any noise generated on data bus 107 by switching of output unit 108, by virtue of the buffer outputs of unit 106 presenting a much greater impedance with respect to the sense amplifier outputs of unit 105.

Data bus 107, also formed by a number of lines, presents a number of switches controlled by a single signal and of which only one, 120, is shown. The control terminal of switch 120 is connected to a line 122 supplying load signal L, so as to normally interrupt data bus 107 except for the time necessary for loading the data.

Output unit 108 is formed by a number of output circuits, each presenting two inputs 123 and 124. Each input 123 is connected to a respective line of data bus 107, and inputs 124 are all connected to an enabling line supplying a common enabling signal OE. The output circuits are typically formed by known latch circuits (not shown). For each output circuit, output unit 108 also presents two outputs 125 and 126 connected to respective gate terminals of two transistors 127 and 128. P-channel transistor 127 presents the source terminal connected to the supply ($V_{DD}$), and the drain terminal connected to an output node 129 to which is also connected the drain terminal of N-channel transistor 128, the source terminal of which is grounded.

Circuit 1 comprises a section 2 that generates a pulse signal ATD for asynchronously enabling timing circuit 1. A section 3 enables reading of the memory cells in array 104. A section 4 generates an equalizing (or precharge) signal PC and detecting signal DET for controlling the reading of the data from array 104 and the supply of the data to unit 106. A section 5 generates a noise suppressing signal N. A section 6 generates a load signal L. A section 7 generates an END signal for resetting the circuit.

Section 2 comprises logic unit 10, which detects a change in the addresses on internal address bus 103, and in response to such a change generates pulse signal ATD on line 11.

Section 3 comprises a flip-flop 12, a buffer 13, and an OR circuit 14. Flip-flop 12 presents a set input S connected to line 11, a reset input R connected to a line 15 supplying the END pulse signal, and an output Q connected to a first input of OR circuit 14. Buffer 13 presents an input 16 supplied with a static read control signal SA supplied by memory 100, and an output connected to a second input of OR circuit 14. The output of OR circuit 14 is connected to the enabling input of amplifying unit 105.

Section 4 comprises three memory elements 20, 21, and 22, the content of which may assume one of two logic states for respectively determining slow or fast timing, a short or long precharge (or equalizing) phase, and a short or long detecting phase, depending on the specific characteristics of memory 100 determined at the debugging phase. The outputs of memory elements 20 and 21 are connected to an adjustable asymmetrical delay unit 24 and the outputs of memory elements 20 and 22 are connected to an adjustable asymmetrical delay unit 23. Both delay units 23 and 24 are formed by a number of asymmetrical elementary delay stages cascade connected and bypassable by lines with switches controlled by the signals supplied by memory elements 20–22, for predetermining the duration of the precharge and detection phases and total timing, as described in detail in co-pending patent application entitled "Internal timing method and circuit for programmable memories, previously incorporated by reference."

More specifically, delay unit 23 presents an enabling input connected to the output of an AND gate 25, which presents a first input connected to output Q of flip-flop 12, and a second input connected to line 11 via an inverter 26. The output of delay unit 23 presents a normally low signal that switches to high after a delay with respect to the instant at which the leading edge of signal ATD is received, such delay depending on the content of memory elements 20 and 22 as explained above (see also FIG. 2). The output of delay unit 23 is connected to a first input of a NOR gate 27, has a second input connected to output QN of flip-flop 12. The output of NOR gate 27 (supplying signal PC) is connected to a first input of a NOR gate 28 having a second input connected to output QN of flip-flop 12. The output of NOR gate 28 (supplying signal DET) is connected to an enabling input of asymmetrical delay unit 24, the output of which generates a data simulating signal SP, which is normally low and with respect to the instant at which the leading edge of signal DET is received, switches to high with a delay determined by the content of memory elements 20 and 21 as described above.

The output of delay unit. 24 is connected to a node 30 and, via a controlled switch 31, is connected to one input 32 of an output simulation circuit 33 having a second input 34 connected to node 30 via an inverter 35. Output simulation circuit 33 presents as similar structure as the output circuits of unit 108, so as to reproduce substantially or exactly the same propagation delay, and, like the output circuits of unit 108, presents two outputs connected to respective transistors 39 and 40 and to the inputs of a NAND gate 38. The drain and source terminals of P-channel transistor 39 are short-circuited and connected to supply line $V_{DD}$, while those of transistor 40 are short-circuited and grounded. Transistors 39 and 40 present a similar geometry as transistors 127 and 128 so as to reproduce the same or substantially the same capacitance.

The output of NAND gate 38 (supplying signal EP) is connected to a node 41, which is connected to a first input of an AND gate 42, which, together with components 31, 33, 35, 38, 39, and 40, forms section 5 for generating signal N. AND gate 42 also presents a second input connected to node 30, and an output connected to line 111 supplying noise suppressing signal N.

Node 41 is also connected to one input of a four-input AND gate 45 and to one input of a three-input AND gate 46, both forming part of section 6 for generating the load signal. Both gates 45 and 46 present a second input connected to node 30, and a third input connected to the output (supplying signal QFF) of a flip-flop 47 having a set input S and a reset input R.

The fourth input of AND gate 45 is connected to the output of an extension enabling block 48 having one input, (supplied with a signal CNT) and generating at the output an extension disabling signal SE, the logic value of which is determined by signal CNT and in turn provides for enabling or disabling extension of the load pulses. The output of AND gate 45 is connected to one input of an OR gate 49, the output of which is connected to the input 50 of a pulse duration extension block 51. Block 51 is composed substantially of a single-switching, edge-delay single-shot circuit generating at output 52 an extended pulse signal STP, which switches to high upon block 51 detecting a leading edge at input 50, and switches to low, after a predetermined delay adjustable to the characteristics of memory 100, upon the signal at input 50 switching to low.

Output 52 of block 51 and the output of AND gate 46 (supplying pulse signal SL) are connected to the inputs of an OR gate 55, the output of which (supplying signal OP) is connected to one input of an AND gate 56 having a second input connected to the output 57 of a timing enabling block 58, which presents an input connected to the output of an AND gate 59. AND gate 59 presents a first input connected to the output of an inverter 63 supplied with an externally generated standby signal SB, and a second input supplied with a timing enabling signal RC. AND gate 56 presents a third input connected to the output 60 of an output enabling block 61 having an input 62 supplied with an enabling signal EN. AND gate 56 generates load signal L supplied along line 122. The output of OR gate 55 is also connected to a first input of an AND gate 64 having a second input connected, to output 57 of block 58, and an output connected to a single-shot circuit 65, the output of which is connected to line 15 and generates the END pulse signal on detecting a trailing edge of the output signal from AND gate 64. Block 58 provides for blocking the timing signals when not required by memory 100, and block 61 provides for disabling data loading into the output circuits, while at the same time maintaining all the other timing functions enabled, as required for certain particular operating or test modes.

Output 52 of block 51 is also connected, via an inverter 67, to input S of flip-flop 47, the input R of which is connected to an input node 68 of circuit 1 supplying standby signal SB. Node 68 is also connected to a first input of an OR gate 69 having a second input connected to a level detector 70, and a third input connected to a static logic forcing block 72. Level detector 70 substantially comprises a threshold comparator supplied with a voltage $V_{IN}$ related to the supply voltage and generated by a block 73, the input of which is supplied with standby signal SB. In steady state mode (logic low standby signal SB), voltage $V_{IN}$ presents a predetermined value above the threshold of level detector 70, which therefore generates a low logic level (signal LL) at the output. Upon SB switching to high, voltage $V_{IN}$ falls below the threshold of detector 70, and signal LL therefore switches to a logic high. When standby signal SB switches back to low, voltage $V_{IN}$ is not restored immediately to the steady state value, due to the delay of generator 73, so that signal LL remains high and only switches back to low when voltage $V_{IN}$ once more rises above the threshold of detector 70.

Static logic forcing block 72 is connected to an input node 74 supplying an externally generated signal SC for setting a static operating mode (e.g. when testing). The output of OR gate 69 (supplying a static operation control signal SPP) is connected to one input of OR gate 49.

In circuit 1, signals OE, SA, SB, SC, CNT, EN, RC and voltage $V_{IN}$ may be supplied by memory 100.

Operation of the timing circuit will now be described with reference also to FIG. 2.

To begin with, the circuit will be assumed to be in steady state operating mode with no extension of the load pulses, and wherein signals SA, CNT, SB and SC are low, signals OE, EN, RC and QFF are high, $V_{IN}$ is above the predetermined threshold, the static operating mode is not activated, and the delays to be generated by units 23 and 24 (and set by fuses 20–22) are minimum. This situation is shown by the continuous-line plots in FIG. 2. Before the start of a reading phase, signals ATD, SAEN, PC, DET, SP, N, SL, SPP, CP STP, L and END are low, and signals EP and QFF are high.

Assuming the addresses on address bus lines 101 and 103 begin switching at instant $t_0$, this switching is detected by logic unit 10, which switches signal ATD to high where it remains until the last address switches. Low-to-high switching of ATD switches output Q of flip-flop 12 and hence signal SAEN to high (enabling sense amplifiers 105), and switches output QN of flip-flop 12 to low so that signal PC switches to high (the output of delay circuit 23 is still low). As such, signal DET remains low. In this phase, therefore, signal PC enables the precharge phase of array 100, wherein array 104 and unit 105 prepare for reading, and the output of AND gate 25 remains low due to the low output of inverter 26.

Upon signal ATD switching back to low, the output of AND gate 25 switches to high, which switching edge is transmitted to unit 23, the output of which switches to high after a predetermined delay (depending on the settings of memory elements 20 and 22). As soon as the output of unit 23 switches to logic high, signal PC switches back to low (as shown by the solid, i.e., continuous, line in FIG. 2, instant $t_1$), so that signal DET switches to high (also shown by the continuous line), thus terminating the precharge phase and commencing the detecting phase of array 100, wherein the content, detected by the sense amplifiers, of the memory cells of array 104 is supplied to data buffer 106.

After a delay depending on the settings of memory elements 20 and 21, the output of delay circuit 24 also switches, so that signal SP switches to high (continuous line, instant $t_2$).

Consequently, being supplied with two "1", AND gate 42 switches, so that signal N switches to high, closing switches 31, 110, 118; AND gate 46 also switches, so that short load signal SL switches to high. As extension of the load pulses is disabled (low output of AND gate 45, hence, low signal CP), signal STP remains low. The output of OR gate 55, however, switches to high, as does output signal L from AND gate 56, thus closing switch 120 and commencing the loading phase as indicated below.

Closure of switch 31 provides for supplying data simulating signal SP to input 32 of output simulation circuit 33, and closure of switch 118 provides for freezing and so preventing undesired switching of the output buffers of unit 106. At the same time, the data in the output buffers of unit 106 begins to propagate into the output circuits (unit 108) which thus switch. Since, as already stated, output buffers 106 are prevented from switching at this phase, the noise generated by such switching of unit 108 (which involves high currents due to charging and discharging of the capacitive elements of the output circuits, and may thus alter the voltage levels in amplifiers 105) is prevented from damaging the data. Similarly, the addresses in buffer unit 102 are also frozen.

Signal SP is thus transmitted to output simulation circuit 33 in the same way and simultaneously with the data to output circuits 108, and, at the end of transmission of SP through circuit 33, the outputs of output simulation circuit 33 switch to a high logic level, and signal EP switches to low (continuous line, instant $t_3$) so that AND gates 42 and 46 switch to logic low. Signal N switches back to low, opening switches 31, 110 and 118. Load signal L also switches to low because, as already stated, extension is disabled and STP is low. Switch 120 also opens thus terminating the data loading phase, which therefore lasts substantially or precisely as long as necessary for the data to propagate through output circuit 108.

Simultaneously with the high-to-low switching of signal L, single-shot circuit 65 receives a trailing edge and generates a pulse. The signal END switches briefly to high, resetting and switching flip-flop 12, such that output Q switches rapidly to low, thus switching signal SAEN and the output of AND gate 25 to low. The sense amplifiers of unit 105, which were kept on throughout reading of the signals, are disabled to reduce power consumption. Delay block 23, by virtue of being asymmetrical, is reset rapidly, and output QN of flip-flop 12 switches to high, thus switching signals DET and SP to low. Switching of SP rapidly resets output simulation circuit 33 which, at instant $t_4$, switches its outputs to low, thus switching circuit 38 so that signal EP switches to high to restore the initial conditions.

It should be pointed out that, by virtue of blocks 23 and 24 being asymmetrical, the leading edge of an ATD pulse immediately after the previous ATD pulse (or at any time before the END pulse is generated) immediately resets the delay lines (blocks 23 and 24) via inverter 26 and AND gate 25, thus blanking any transmission in progress and restoring the initial conditions (the output of block 23, if already high, switches immediately to low, thus switching PC immediately to high and DET, and possibly SP, to low), and starts the precharge and equalizing (or detecting) phases from the beginning, so that the delays with which data simulating signal SP is generated as of the last ATD pulse are always the same.

Operation as described above is repeated whenever switching of the addresses is detected and logic unit 10 generates an ATD signal pulse, and as long as signal CNT is low and no static, standby or low-power operating conditions are present.

Figure 2:
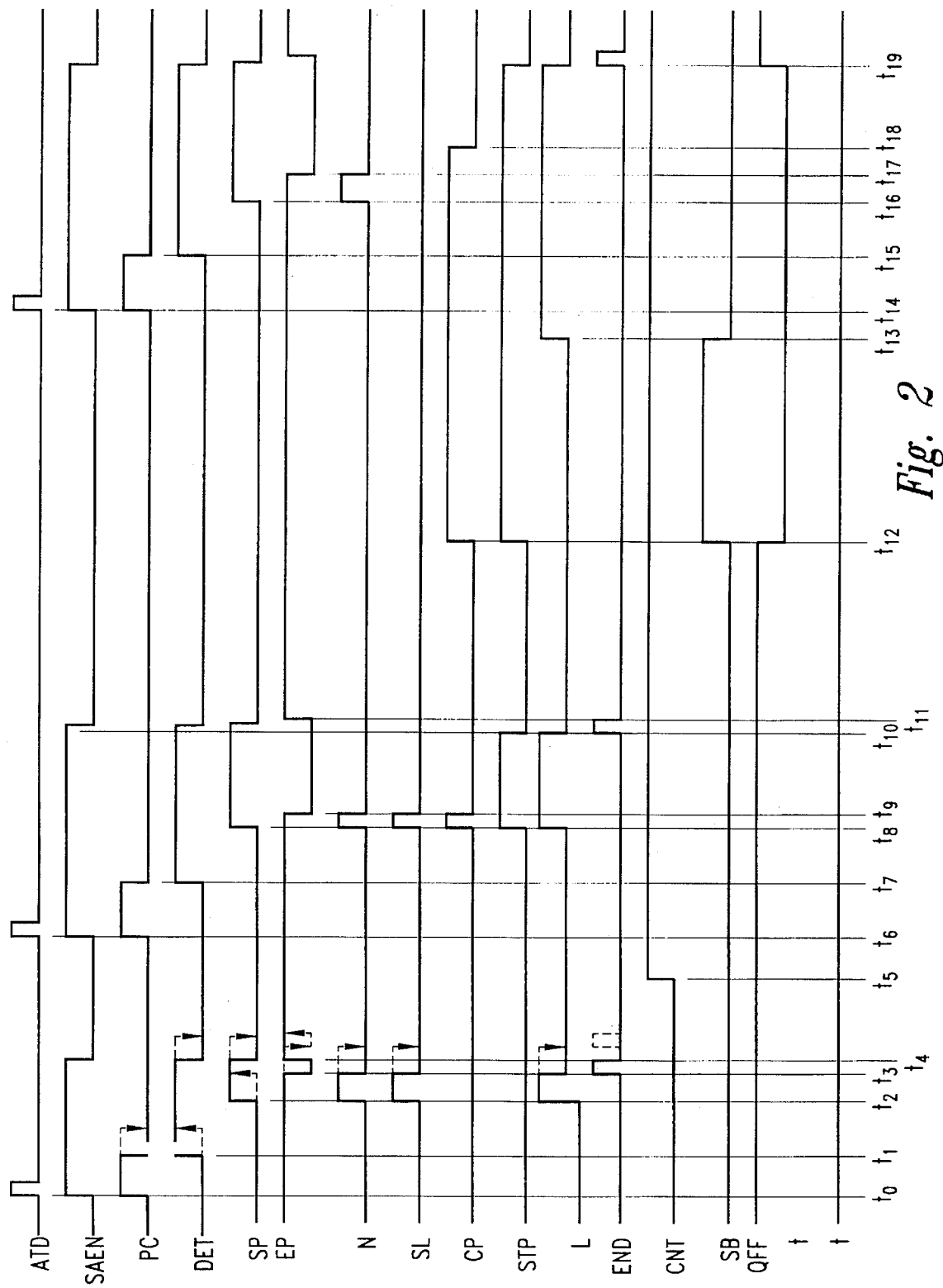
FIG. 2 is a timing diagram for various signals of the FIG. 1 circuit.

FIG. 2 also shows the timing obtained with a longer delay setting of unit 23 and a minimum delay setting of unit 24. For comparison purposes, the slower timing is indicated by the dotted line over the faster timing described above. In this case, PC switches to zero with a delay as compared with previously, thus resulting in a corresponding delay in the switching of the other signals. Similarly, the delay with which unit 24 switches on receiving the trailing edge of PC may be increased, to vary the duration of the precharge and detecting phases as well as the overall duration of the cycle, according to the speed characteristics of memory array 104, so as to set the minimum delay for ensuring reading of most of the elements of array 104.

If, on the other hand, extension of the load signal is enabled, data loading into output circuit unit 108 continues even after the end of the signal N pulse, as described below.

Assuming signal CNT switches to high at instant $t_5$, as described above, SAEN and PC immediately switch to high when the pulse ATD is generated (instant $t_6$). After the predetermined delay (instant $t_7$), PC again switches to low, and DET to high. At instant $t_8$, signals SP, N and SL switch to high. In this case, signal SE being high, the output of AND gate 45 also switches so that signals CP, STP, OP and L switch to high.

Switches 31, 110, 118 and 120 therefore close, and the data simulating signal begins propagation through output simulation circuit 33, and the data through output unit 108. At the same time, the data in address buffers 102 and output buffers 106 is frozen.

As previously discussed, switching of the outputs of circuit 33 and NAND gate 38 switches signal EP to low (instant $t_9$) and terminates the pulses of signals N, SL and CP to open switches 31, 110 and 118. In this case, however, signal STP remains high for the time determined by block 51, so that load signal L remains high and switch 120 closed, and any delayed data supplied by sense amplifiers switching after most of the others, due to the delay of corresponding elements of array 104, may be loaded by the output buffers of unit 106 into corresponding output circuits of unit 108.

At instant $t_{10}$, signals STP and L also switch to low, thus opening switches 120 and separating the output circuits 108 from buffer unit 106. As previously discussed, high-to-low switching of signal STP results in similar switching of the output of AND gate 64, thus enabling single-shot circuit 65, which generates an END signal pulse to reset flip-flop 12. Outputs Q and QN of the flip-flop therefore switch to low and high respectively, so that signals SAEN, DET and SP switch to low. At instant $t_{11}$, signal EP switches to high to restore circuit 1 to the reset condition.

Operation as described above is repeated as long as signal SB remains low. Supposing, now, memory 100 switches to standby at instant $t_{12}$. Switching of SB resets flip-flop 47, the output signal QFF of which switches to low, thus disabling AND gates 45 and 46 and switching static operating signal SPP to high. CP therefore switches to high, as does STP. Switching of SB switches inverter 63, the output of which switches to low, as does the output of AND gate 59, which therefore disables timing (low signal at output 57 of block 58) so that L remains low. In this phase, signal LL switches to high due to the fall in voltage $V_{IN}$ caused by switching of SB.

The above condition continues as long as signal SB remains high. When SB switches to low (instant $t_{13}$), signal L switches to high, due to switching of inverter 63 and AND gate 59, thus permitting reading in static mode. The rest of the circuit, however, remains unchanged in that, as already stated, it takes some time for $V_{IN}$ to reach the steady state condition, during which interval LL therefore remains high. In this condition, even if a pulse ATD is generated (as shown at instant $t_{14}$), section 6 generating the load signal remains in static mode as described below. Generation of the pulse ATD in fact produces the phase sequence described above with reference to sections 2–5, so that, at instant $t_{14}$, SAEN and PC switch to high. At instant $t_{15}$, PC switches to low and DET to high. At instant $t_{16}$, SP and N switch to high, and being disabled, gates 45 and 46 do not switch (SL remains low) L remains high, and, at instant $t_{17}$, EP and N switch to low with no change in the state of section 6.

Assuming, now, that at instant $t_{18}$ controlled voltage $V_{IN}$ again exceeds the predetermined threshold, so that LL, SPP and CP switch to low. In this condition, the load signal L remains high to permit reading long enough to ensure correct data acquisition despite the previous critical condition. After the predetermined delay (instant $t_{19}$), signal STP switches to low, so that signal L also switches to low, and single-shot circuit 65 generates a pulse END to reset flip-flip 12 and sections 3–5 and switch SAEN, DET, SP and EP. Switching of signal STP also sets flip-flop 47 and re-enables gates 45 and 46, thus terminating the static operating phase and restoring the circuit to normal operating mode as described above (instants $t_6$–$t_{11}$).

The same static operation is enabled if requested by memory 100 or other devices connected to it (e.g. for special functions, such as testing, checking data from registers or other parts of the memory, etc.) via signal SC at input 74, and in the event, for any reason, of a fall in voltage ($V_{IN}$ below the predetermined threshold) which may result in reading errors.

If timing is disabled (low signal RC), the output of AND gate 59, and hence of block 58, is low and disables AND gates 56 and 64. At the end of timing, therefore, no reset signal END is generated, so that the whole of circuit 1 is in fact disabled. Signal EN, on the other hand, as already stated, disables data loading to output 129.

Figure 3:
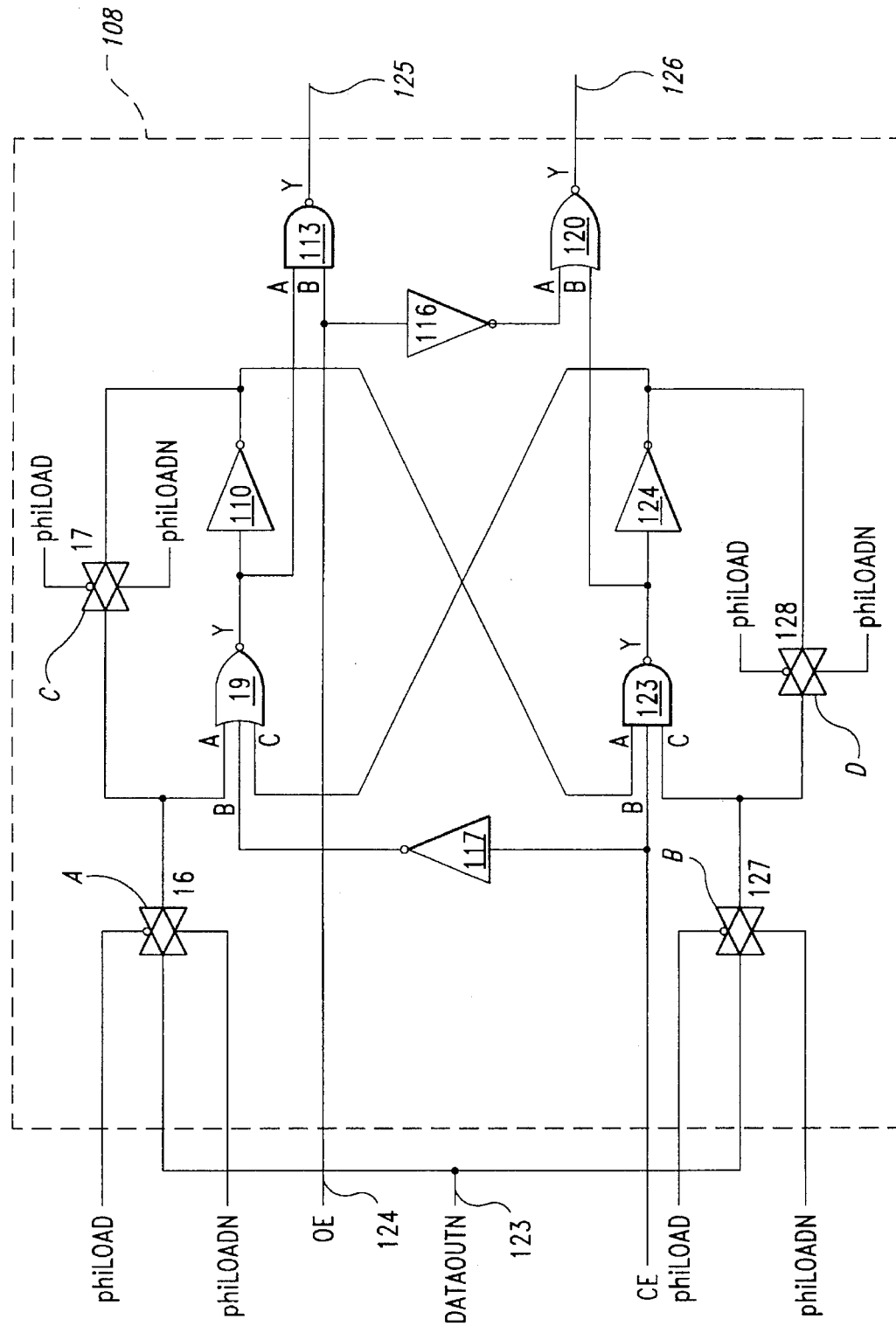
FIG. 3 is a schematic diagram of an embodiment of the output circuit of FIG. 1.

FIG. 3 is a circuit diagram of one embodiment of the output circuit 108 of FIG. 1. In operation, gates I9 and I23, which form a latch circuit, are fed with signal DATAOUTN on line 123 when switches A and B are closed, i.e., when signal phiLOAD is logic high, and signal phiLOADN is logic low. Switches C and D are open during the period when switches A and B are closed. Next, when signals phiLOAD and phiLOADN switch, i.e., phiLOAD becomes low and phiLOADN becomes logic high, the data input to gates I9 and I23 is transferred to output gates I13 and I20. Also, switches A and B open and switches C and D closed. Enable signal OE on line 124 enables the data transferred to gates I13 and I20 to be transferred to output lines 125 and 126 and thus to output pad 129 as discussed above regarding FIG. 1. Signal OE and another optional enable signal CE are generated in other parts of memory circuit 1 in order to disable output circuit 108 when the outputting of data is not required. Signal phiLOAD is typically generated within memory 100 to synchronize output circuit 108 to the other circuits within memory 100. Signal phiLOADN is obtained by inverting signal phiLOAD.

Figure 4:
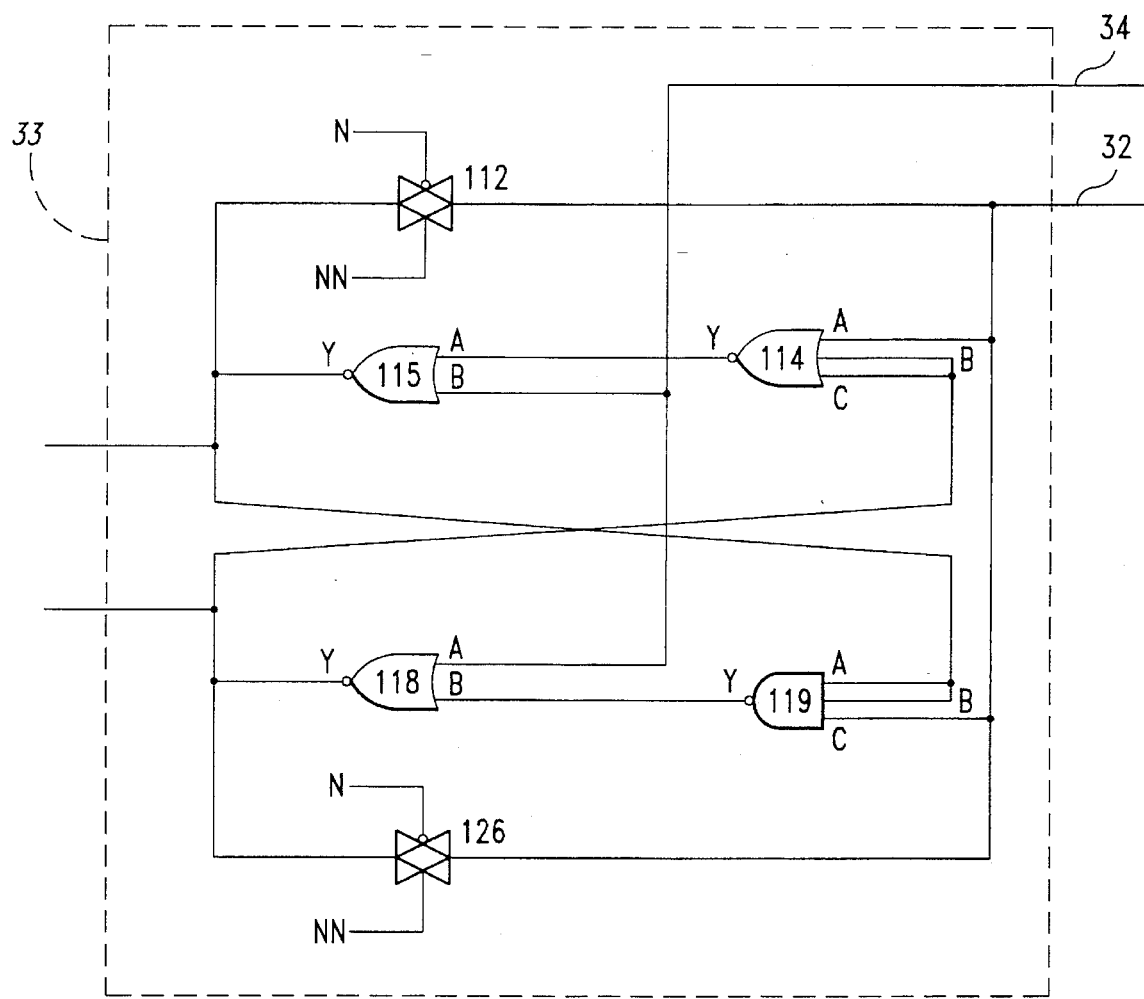
FIG. 4 is a schematic diagram of an embodiment of the output simulation circuit of FIG. 1.

FIG. 4 is a circuit diagram of output simulation circuit 33 of FIG. 1 according to one aspect of the invention. Circuit 33 is constructed to provide the same or substantially the same delay as output circuit 108 of FIG. 1. In all aspects other than propagation delay, it is unnecessary that output simulation circuit 33 be equivalent to output circuit 108. Typically, however, simulation circuit 33 includes the same number of gates having similar delay characteristics as output circuit 108, along the signal propagation line (which is between line 123 and lines 125 and 126 of output circuit 108, and between input 32 and the outputs of simulation circuit 33). In one aspect of the invention, the delays along the signal propagation lines for output circuit 108 and simulation circuit 33 are both approximately 5 nanoseconds. Signal NN is the inversion of signal N.

Figure 5:
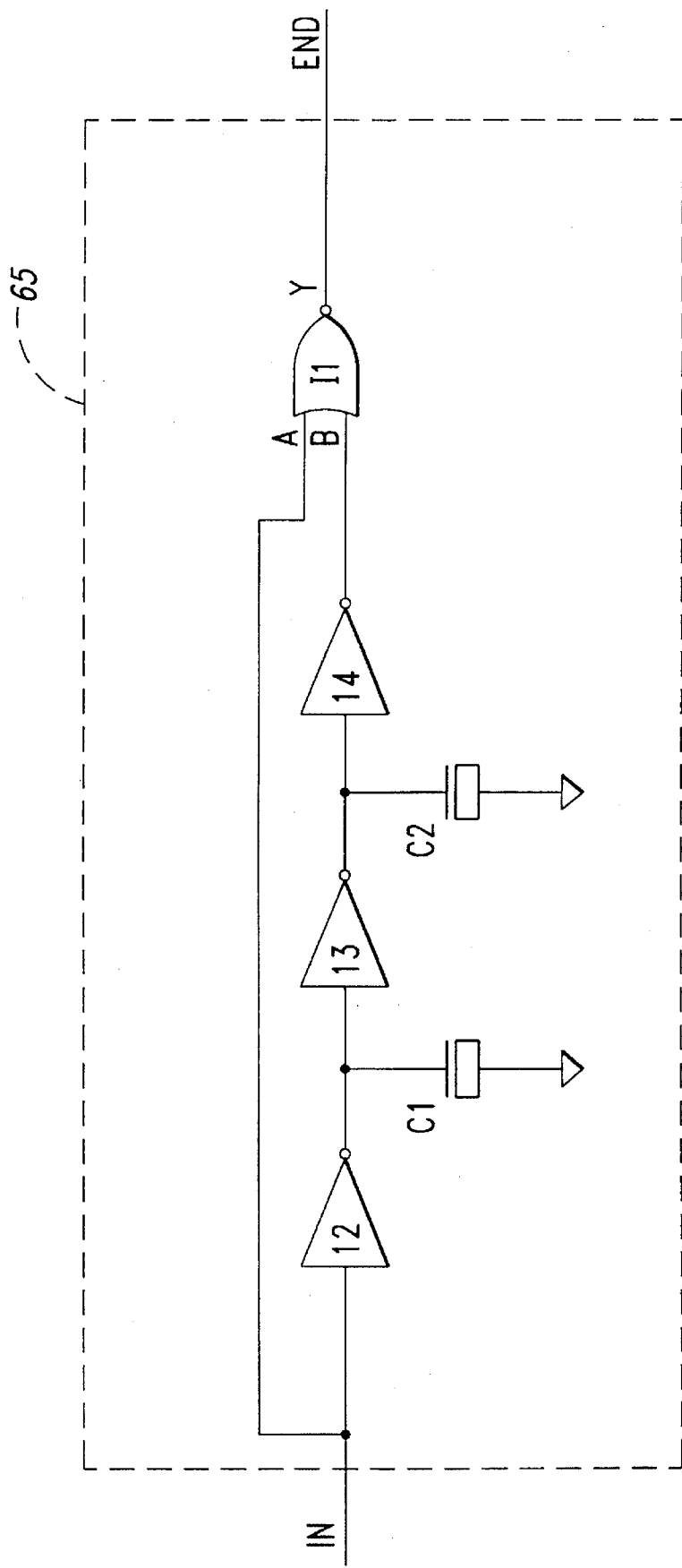
FIG. 5 is a schematic diagram of the single shot circuit of FIG. 1.

FIG. 5 is a circuit diagram of single shot circuit 65 of FIG. 1 according to one aspect of the invention. Single shot circuit 65 includes three inverters and two capacitors arranged so as to form a delay line such that one input of NOR gate I1 switches at a time after the other input. For example, an initial condition may be when the input signal IN is low, input B to NOR gate I1 is logic high, and output signal END is logic low. When signal IN switches to logic high, both inputs A and B are logic high, and signal END remains logic low. END also remains logic low even when input B switches to a logic low. When signal IN switches to a logic low, both inputs A and B are then logic low, so END switches to a logic high and remains at a logic high until the falling edge of signal IN has propagated along the delay line formed by the inverters and capacitors. Then, input B becomes logic high, and the signal END transitions to a logic low.

The circuit described therefore provides for a timed architecture (and hence an intrinsic reduction in power consumption and noise, and high speed) which nevertheless takes into account any technological differences, slow-speed situations or local problems, by modulating at various points the basic signals and cycle times. More specifically, the circuit and method according to the present invention provide for adjusting the data read and load times between the memory array and sense amplifiers to take into account the time required by the majority of the elements. The possibility of regulating the duration of the load pulse also provides for salvaging any very slow elements, with no need for an excessive increase in precharging and, especially, evaluation time (which would result in an unacceptable increase in noise), or for renouncing the slower elements, thus also reducing the need for redundant elements. Freezing the data and addresses during external loading of most of the data provides for effectively eliminating a major source of noise and ensuring highly reliable operation of the memory. Loading of any slower data after freezing, by generating an extended load signal, does not involve a serious amount of noise in view of the much smaller number of outputs switching in this phase. Finally, by virtue of the output simulation circuit 33, the freezing phase and at least the first part of the loading phase are so set as to present as short a duration as possible, thus providing for the maximum cycle speed compatible with the characteristics of the memory, while at the same time ensuring the data of most of the memory elements is fully loaded into the output elements. The architecture described is also capable of operating in static mode when necessary, e.g. in the event the conditions of the circuit are not definitely known.

Clearly, changes may be made to the method and circuit as described and illustrated herein without, however, departing from the scope of the present invention.

We claim:

1. A read timing method for a nonvolatile memory comprising at least an output element, a buffer unit, and an output simulation unit presenting a same or substantially the same propagation time as said output element; characterized in that it comprises, in combination, the steps of:

generating a read enabling signal;

enabling a precharge phase of predetermined adjustable duration on receiving said read enabling signal;

enabling an evaluation phase at the end of said precharge phase;

generating a data simulating signal a predetermined adjustable time after enabling said evaluation phase;

enabling propagation of said simulating signal in said output simulation unit, and simultaneously enabling data loading from said buffer unit in said output circuit, and disabling switching of said buffer unit;

interrupting said step of disabling switching, on detecting propagation of said simulating signal;

interrupting said loading phase after a predetermined adjustable delay; and resetting said nonvolatile memory following disabling of said load signal.

2. A method as claimed in claim 1, characterized in that said steps of enabling a precharge phase and an evaluation phase each comprise the step of generating a precharge enabling signal and, respectively, evaluation enabling signal; transmitting said precharge enabling signal and, respectively, said evaluation enabling signal along a respective propagation line; and selectively enabling predetermined delays on said respective propagation line according to the speed characteristics of said nonvolatile memory.

3. A method as claimed in claim 1, characterized in that said step of enabling propagation comprises the step of supplying said data simulating signal to said output simulation unit; said output simulation unit being similar or identical to said output element.

4. A method as claimed in claim 1, characterized in that said steps of enabling and interrupting a loading phase comprise the step of generating a short pulse simultaneously with said step of disabling switching; interrupting said short pulse simultaneously with said step of interrupting said step for disabling switching; generating a long pulse from said short pulse, said long pulse being enabled simultaneously with said short pulse and being disabled with a predetermined delay with respect to said short pulse; and selectively picking up said long pulse or said short pulse.

5. A read timing circuit for a nonvolatile memory comprising at least an output element and a data buffer unit; said circuit comprising read enabling means for generating a read enabling signal; precharge enabling means enabled by said read enabling signal; and detection enabling means for generating a detection enabling signal; characterized in that it comprises:

duration modifying means for disabling said precharge enabling means and enabling said detection enabling means a predetermined adjustable time after receiving said read enabling signal;

simulating generator means enabled by said detection enabling means, for generating a data simulating signal a predetermined adjustable time after receiving said detection enabling signal;

an output simulation circuit having the same propagation time as said output element and connected to said simulating generator means;

data blocking means connected to said data buffer unit, for preventing switching of said data buffer unit;

simultaneous enabling means for said output simulation circuit, said output element and said data blocking means, for simultaneously propagating said data simulating signal in said output simulation circuit, loading data from said data buffer unit to said output circuit and disabling said data buffer unit;

propagation detecting means connected to said output simulation circuit, for generating a disabling signal for said simultaneous enabling means;

load extending means for generating an extended load signal for said output circuit;

selective enabling means for selectively enabling said load extending means; and circuit resetting means.

6. A circuit as claimed in claim 5, characterized in that said output simulation circuit is identical to said output element.

7. A circuit as claimed in claim 5, characterized in that said data blocking means comprise a feedback line connecting the input and output of said data buffer unit; and first switching means located on said feedback line and controlled by said simultaneous enabling means.

8. A circuit as claimed in claim 5, characterized in that said simultaneous enabling means comprise first logic circuits connected to said simulating generator means and to said propagation detecting means, for generating a noise suppressing signal for enabling said data blocking means; second logic circuits connected to said simulating generator means and to said propagation detecting means, for generating a data loading signal; second switching means interposed between said simulating generator means and said output simulation circuit and having a control terminal supplied with said noise suppressing signal; and third switching means interposed between said data buffer unit and said output circuit and having a control terminal supplied with said data loading signal.

9. A circuit as claimed in claim 8, in a nonvolatile memory also comprising an address buffer unit; characterized in that it also comprises address blocking means connected to said first logic circuits and to said address buffer unit, for preventing switching of said address buffer unit in the presence of said noise suppressing signal.

10. A circuit as claimed in claim 5, characterized in that said load extending means comprise delay means having an input connected to said simulating generator means and supplied with said data simulating signal; a second input connected to said propagation detecting means and supplied with said disabling signal; and an output supplying said extended load signal enabled upon reception of said data simulating signal and disabled with a predetermined delay upon detection of said disabling signal.

11. A circuit as claimed in claim 5, characterized in that said selective enabling means comprise fourth switching means interposed between said simultaneous enabling means and said load extending means, and having at least one control terminal connected to extension disabling means.

12. A circuit as claimed in claim 11, characterized in that said selective enabling means also comprise static mode setting means generating a static mode signal for continuously enabling said load extending means.

13. A circuit as claimed in claim 8, characterized in that it comprises selecting means having a first input connected to said simultaneous enabling means; a second input connected to said load extending means; and an output connected to said control terminal of said third switching means; and in that said resetting means comprise monostable means having an input connected to said selecting means; and an output connected to said precharge enabling means.

* * * * *